(12) United States Patent
Yoo

(10) Patent No.: US 8,759,736 B2
(45) Date of Patent: Jun. 24, 2014

(54) COLUMN CIRCUIT AND PIXEL BINNING CIRCUIT FOR IMAGE SENSOR

(75) Inventor: Si-Wook Yoo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 646 days.

(21) Appl. No.: 12/943,255

(22) Filed: Nov. 10, 2010

(65) Prior Publication Data

US 2012/0006972 A1 Jan. 12, 2012

(30) Foreign Application Priority Data

Jul. 7, 2010 (KR) .................. 10-2010-0065329

(51) Int. Cl.
*H01L 27/00* (2006.01)

(52) U.S. Cl.
USPC ........ 250/208.1; 348/301; 348/302; 348/311; 348/312; 348/319

(58) Field of Classification Search
USPC ............... 250/208.1; 348/301–302, 311–312, 348/319, 300
See application file for complete search history.

(56) References Cited

U.S. PATENT DOCUMENTS

| 6,292,218 B1 | 9/2001 | Parulski et al. | |
|---|---|---|---|
| 6,801,258 B1 | 10/2004 | Pain et al. | |
| 2005/0012836 A1* | 1/2005 | Guidash | 348/302 |
| 2005/0103977 A1* | 5/2005 | Krymski | 250/208.1 |
| 2005/0133687 A1* | 6/2005 | Bock | 250/208.1 |
| 2006/0113459 A1* | 6/2006 | Yang et al. | 250/208.1 |
| 2008/0006764 A1* | 1/2008 | Boemler | 250/208.1 |
| 2008/0136933 A1* | 6/2008 | Dosluoglu et al. | 348/223.1 |
| 2008/0205792 A1 | 8/2008 | Andersen | |
| 2009/0016625 A1 | 1/2009 | Kim et al. | |
| 2010/0194945 A1* | 8/2010 | Chiu et al. | 348/300 |

FOREIGN PATENT DOCUMENTS

| KR | 100913797 | 8/2009 |
|---|---|---|
| WO | WO 2005/050977 | 6/2005 |
| WO | WO 2009/099540 | 8/2009 |

OTHER PUBLICATIONS

Notice of Allowance issued by the Korean Intellectual Property Office on Oct. 15, 2012.

* cited by examiner

*Primary Examiner* — Georgia Y Epps
*Assistant Examiner* — Kevin Wyatt
(74) *Attorney, Agent, or Firm* — IP & T Group LLP

(57) ABSTRACT

A column circuit for an image sensor includes a first column read circuit configured to read data of a first column line, and a second column read circuit configured to read data of a second column line, wherein, during a binning mode, data from two or more pixels are outputted through the first column line and stored in the first column read circuit in a first phase, data from two or more pixels are outputted through the second column line and stored in the second column read circuit in a second phase, and charges are shared between the first column read circuit and the second column read circuit in a third phase.

8 Claims, 5 Drawing Sheets

COLUMN CIRCUIT AND PIXEL BINNING CIRCUIT FOR IMAGE SENSOR

CROSS-REFERENCE TO RELATED APPLICATIONS

The present application claims priority of Korean Patent Application No. 10-2010-0065329, filed on Jul. 7, 2010, which is incorporated herein by reference in its entirety.

BACKGROUND OF THE INVENTION

Exemplary embodiments of the present invention relate to a technology for binning a plurality of pixel data.

Demands for digital cameras are explosively increasing along with the advancement of video communication through the Internet. Also, as mobile communication terminals, such as Person Digital Assistants (PDAs) and Code Division Multiple Access (COMA) terminals, equipped with cameras become popular, the demands for small-sized camera modules are increasing as well.

A camera module basically includes an image sensor. An image sensor generally refers to a device for transforming an optical image into electrical signals. As for the image sensor, a Charge Coupled Device (CCD) and a complementary metal-oxide semiconductor (CMOS) image sensor are widely used.

The CCD is complicated in its driving method, consumes much power, and has a complex fabrication process due to many masking processes. Moreover, since a signal processing circuit cannot be realized within a single chip, it may be difficult to embody the CCD as one chip. On the contrary, a CMOS image sensor can have monolithic integration of control, driving, and signal processing circuits in a single chip. Moreover, it may be more economical to use the CMOS image sensor than to use the conventional CCD, because the CMOS image sensor may operate at a lower power level, consume a smaller amount of power, and be compatible with more peripheral devices in comparison to the CCD and there is a useful standard CMOS fabrication process established.

The number of pixels of an image sensor increases, as technology progresses. In other words, the definition/resolution of an image sensor increases. The increased definition leads to an increase in the amount of data to be processed. Therefore, a technology of binning data of a plurality of pixels into/as one data is being used. According to the conventional pixel binning technology, binning is performed on a pixel array. In this case, however, binning is limited to using a certain pixel structure.

SUMMARY OF THE INVENTION

Exemplary embodiments of the present invention are directed to a column circuit and a binning circuit for an image sensor that may perform a binning function regardless of a pixel structure.

In accordance with an exemplary embodiment of the present invention, a column circuit for an image sensor includes a first column read circuit configured to read data of a first column line, and a second column read circuit configured to read data of a second column line, wherein, during a binning mode, data from two or more pixels are outputted through the first column line and stored in the first column read circuit in a first phase, data from two or more pixels are outputted through the second column line and stored in the second column read circuit in a second phase, and charges are shared between the first column read circuit and the second column read circuit in a third phase.

In accordance with another exemplary embodiment of the present invention, a column circuit for an image sensor includes a first capacitor, a second capacitor, a first switch configured to couple a first column line with a first node, a second switch configured to couple a is second column line with a second node, a first current source coupled with the first node, a second current source coupled with the second node, a third switch configured to couple the first capacitor with the first node, a fourth switch configured to couple the second capacitor with the second node, and a fifth switch configured to couple the first node with the second node.

In accordance with yet another exemplary embodiment of the present invention, a pixel binning circuit includes a data node configured to receive data of two or more pixels through a first column line in a first phase, and receive data of two or more pixels through a second column line in a second phase, a discharge unit configured to discharge charges of the data node in the first phase and the second phase, a first capacitor coupled with the data node in the first phase and a third phase, and a second capacitor coupled with the data node in the second phase and the third phase.

BRIEF DESCRIPTION OF THE DRAWINGS

FIG. 4A illustrates a first-phase operation, FIG. 4B illustrates a second-phase operation, and FIG. 4C illustrates a third-phase operation.

DESCRIPTION OF SPECIFIC EMBODIMENTS

Figure 1:
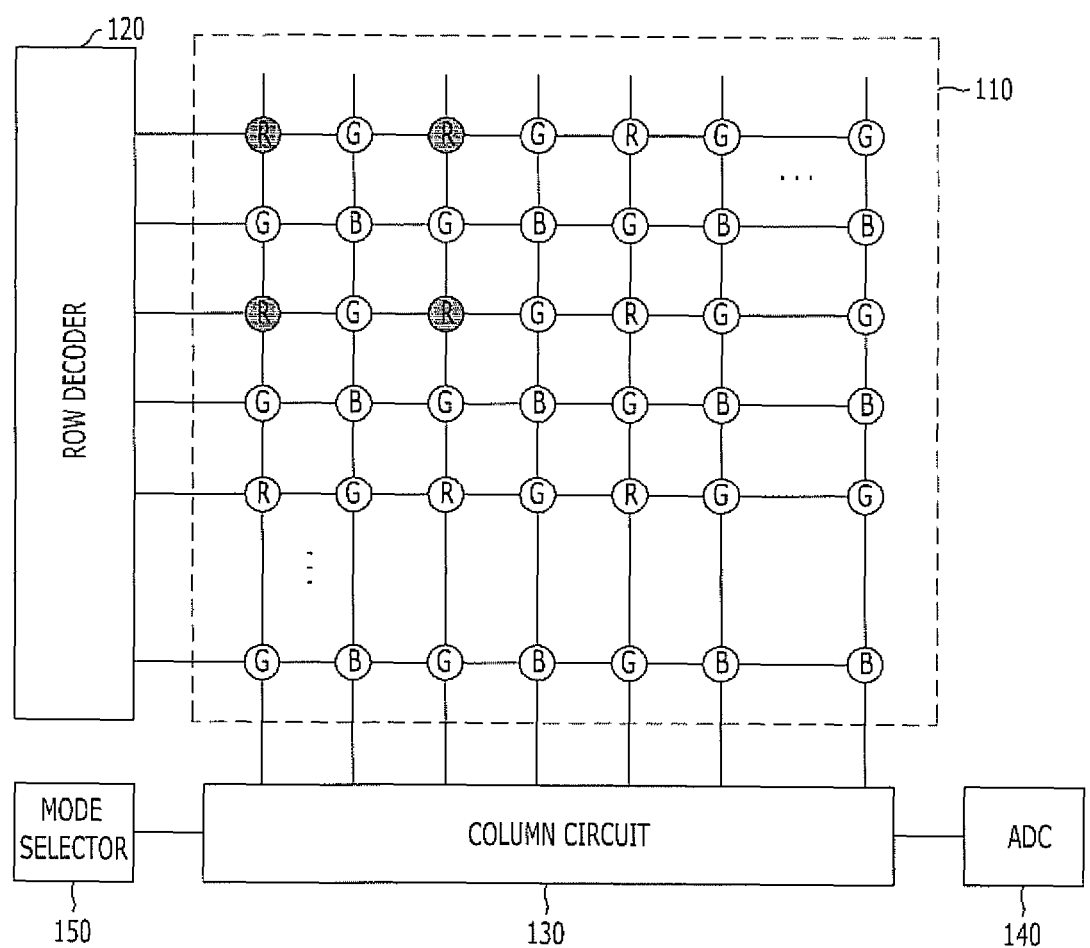
FIG. 1 illustrates a pixel array and an adjacent region of an image sensor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 illustrates a pixel array and adjacent region of an image sensor.

Referring to FIG. 1, the image sensor includes a pixel array 110 including a plurality of pixels, a row decoder 120 for selecting a row of pixel data to be outputted, a column circuit 130 for reading data outputted through a column line, an analog-to-digital converter (ADC) 140 for converting analog data read in the column circuit 130 into digital data, and a mode selector 150 for selecting a binning mode or a normal mode.

The pixel array 110 includes a plurality of pixels and each pixel is formed to sense one of three colors, which are red R, green G, and blue B. Generally, the number of pixels for sensing a green G color is twice as many as the number of pixels for sensing the other colors. A binning operation of pixels is performed for data of neighboring pixels for sensing the same color. For example, when pixels are binned in a 2×2 scheme, the binning operation with respect to the red R pixels is performed using two consecutive red R pixels in the row direction and two consecutive red R pixels in the column direction, as shown by the shaded red R pixels in FIG. 1.

The row decoder 120 selects one or more rows of pixel data to be outputted from the pixel array 110. During a normal operation, the row decoder 120 performs a control to output the pixel data of a selected row. During a binning operation, the row decoder 120 performs a control to output the pixel data of two or more rows to be binned. The column circuit 130 is a circuit for reading the pixel data outputted through a column line. The column circuit 130 according to an exemplary embodiment of the present invention supports a binning operation in the binning mode, as well as, the read operation in the normal mode. The column circuit 130 is described in more detail is below with reference to the accompanying drawings.

The ADC 140 converts the data (or binned data) read in the column circuit 130 into digital data.

Figure 2:
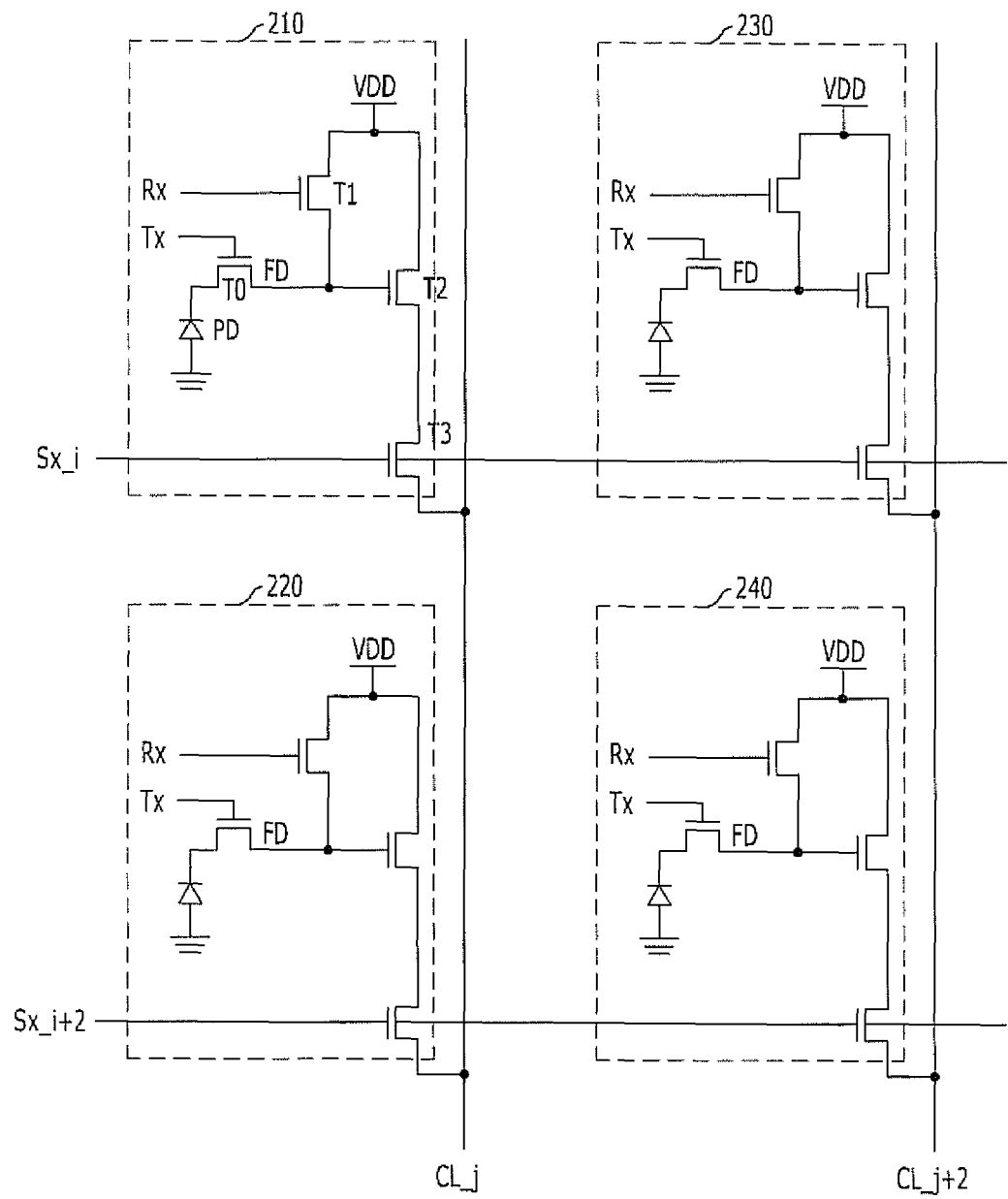
FIG. 2 illustrates four pixels from which data are binned into one data.

FIG. 2 illustrates four pixels from which data are binned into one data.

As described above, since pixel binning is performed for adjacent pixels of the same color, where 'i' it corresponds to a row number and 'j' corresponds to a column number, an (i, j) pixel 210, an (i+2, j) pixel 220, an (i, j+2) pixel 230, and an (i+2, j+2) pixel 240 are combined.

Referring to the (i, j) pixel 210, the internal structure of a pixel is described hereafter. The pixel 210 includes a photodiode PD, a floating diffusion FD region, and four transistors T0 to T3. The four transistors T0 to T3 include the transfer transistor T0, the reset transistor T1, the drive transistor T2, and the select transistor T3. The transfer transistor T0 transfers photo-generated charges collected in the photodiode PD to the floating diffusion FD region in response to a transmission signal Tx. The reset transistor T1 sets a potential of the floating diffusion FD region to a target value and discharges charges to reset the floating diffusion FD region in response to a reset signal Rx. The drive transistor T2 operates as a buffer amplifier according to the charges accumulated in the floating diffusion FD region. The select transistor T3 transfers pixel data based on the driving of the drive transistor T2 to a column line CL_j in response to a value of a row line Sx_i. The value of a row line Sx_i may be either a logic high level 'H' or a logic low level 'L' depending on whether the row line Sx_i is selected. For example, when an $i^{th}$ row is selected, the row line Sx_i has a value of 'H,' and when the $i^{th}$ row is not selected, the row line Sx_i has a value of 'L.'

One row is selected in the pixel array during the normal operation. For example, the row decoder 120 makes only one row line have an H level among a plurality of row lines Sx_0 to Sx_N. For example, when an $i^{th}$ row is selected, the row line Sx_i has an H level, and all the other row lines have L levels. Likewise, when an $(i+2)^{th}$ row is selected, the row line Sx_i+2 has an H level, and all the other row lines have L levels.

During a binning operation, more than two row lines are selected. In other words, the row decoder 120 makes the row lines corresponding to the pixels from which data are to be binned have H levels simultaneously. Therefore, when the data of the pixel 210 and the pixel 220 are binned and when the data of a pixel 230 and a pixel 240 are binned, the row line Sx_i and the row line Sx_i+2 are controlled to have H levels simultaneously.

Figure 3:
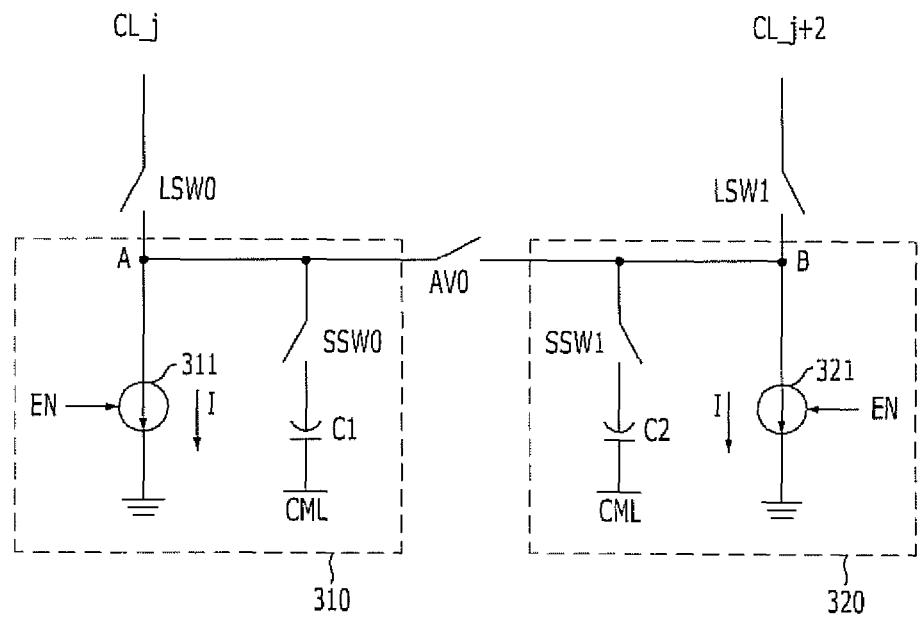
FIG. 3 illustrates a block view of a column circuit shown in FIG. 1.

FIG. 3 illustrates a block view of the column circuit 130.

Referring to FIG. 3, the column circuit 130 includes a first capacitor C1; a second capacitor C2; a first switch LSW0 coupling a first column line CL_j with a first node A; a second switch LSW1 coupling a second column line CL_j+2 with a second node B; a first current source 311 coupled with the first node A; a second current source 321 coupled with the second node B; a third switch SSW0 coupling the first capacitor C1 with the first node A; a fourth switch SSW1 coupling the second capacitor C2 with the second node B; and a fifth switch AV0 coupling the first node A with the second node B.

A first column read circuit 310 is a circuit for reading data from the first column line CL_j, and a second column read circuit 320 is a circuit for reading data from the second column line CL_j+2. The first column read circuit 310 and the second column read circuit 320 perform data reading operations in the normal mode and the binning mode.

Herein, a line CML coupled with the first capacitor C1 and the second capacitor C2 has a common mode level.

Although a portion corresponding to two column lines in the column circuit 130 is illustrated, portions corresponding to the other lines may be constituted in the same way as shown in FIG. 3.

Figure 4A:
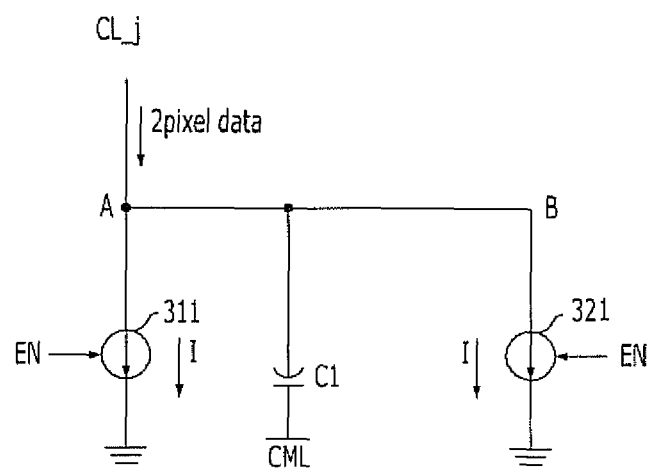
FIGS. 4A, 4B and 4C illustrate a binning mode operation of the column circuit shown in FIG. 3.
Figure 4B:
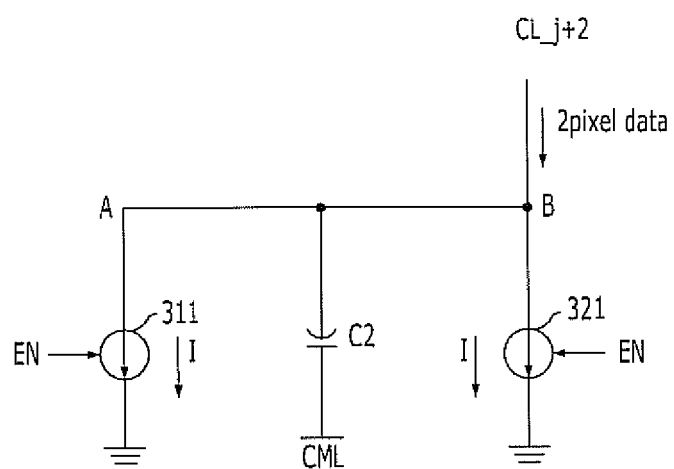
Figure 4C:
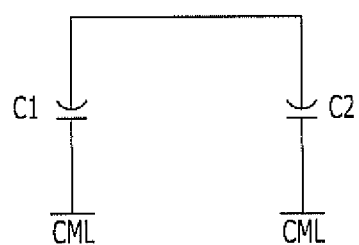

FIGS. 4A, 4B and 4C illustrate a 2×2 binning mode operation of the column circuit 130. FIG. 4A illustrates a first-phase operation, FIG. 4B illustrates a second-phase operation, and FIG. 4C illustrates a third-phase operation.

(1) $1^{ST}$-Phase Operation of Binning Mode

In the first phase of the binning mode, the first switch LSW0, the third switch SSW0, and the fifth switch AV0 are closed (e.g., turned on) and have the coupling status shown in FIG. 4A. Also, an enable signal EN for enabling the first current source 311 and the second current source 321 is enabled.

In the first phase, data of the (i, j) pixel 210 and the (i+2, j) pixel 220 are outputted through the first column line CL_j, and the data of the two pixels 210 and 220 are stored in the first capacitor C1. Since the data of the two pixels 210 and 220 are outputted through the first column line CL_j, current as much as 2I, where I is a current of an amount needed to read one pixel data, is to flow in order to store the data of the first column line CL_j in the first capacitor C1. Since both of the first current source 311 and the second current source 321 are coupled with the first column line CL_j in the first phase, the current condition may be satisfied.

(2) $2^{ND}$-Phase Operation of Binning Mode

In the second phase of the binning mode, the second switch LSW1, the fourth switch SSW1, and the fifth switch AV0 are closed (e.g., turned on) and have the coupling state shown in FIG. 4B. Also, the enable signal EN for enabling the first current source 311 and the second current source 321 is enabled.

In the second phase, data of the (i, j+2) pixel 230 and the (i+2, j+2) pixel 240 are outputted through the second column line CL_j+2, and the data of the two pixels 230 and 240 are stored in the second capacitor C2. Since the data of the two pixels 230 and 240 are outputted through the second column line CL_j+2, current as much as 2I, where I is a current of an amount needed to read one pixel data, is to flow in order to store the data of the second column line CL_j+2 in the second capacitor C2. Since both of the first current source 311 and the second current source 321 are coupled with the second column line CL_j+2 in the second phase, the current condition may be satisfied.

(3) $3^{RD}$-Phase Operation of Binning Mode

In the third phase of the binning mode, the fifth switch AV0 is closed (e.g., turned on) and has the coupling state shown in FIG. 4C. Also, the enable signal EN for enabling the first current source 311 and the second current source 321 is disabled.

In the third phase, charges are shared between the first capacitor C1 and the second capacitor C2. Therefore, binning data obtained by binning the data of the first to fourth pixels 210 to 240 is stored in the first capacitor C1 and the second capacitor C2.

The binning data stored in the first capacitor C1 and the second capacitor C2 is converted into a digital value through an analog-to-digital conversion by the ADC 140 shown in FIG. 1.

Although a 2×2 binning is illustrated in the above embodiment, the technology according to the exemplary embodiment of the present invention may be applied to not only the 2×2 binning, but also binning of another size. For example, when the technology according to the exemplary embodiment of the present invention is applied to a 3×3 binning, three pixel data are outputted through each of first to third column lines, and the 3×3 binning may be performed under the control of three data read circuits.

Figure 5:
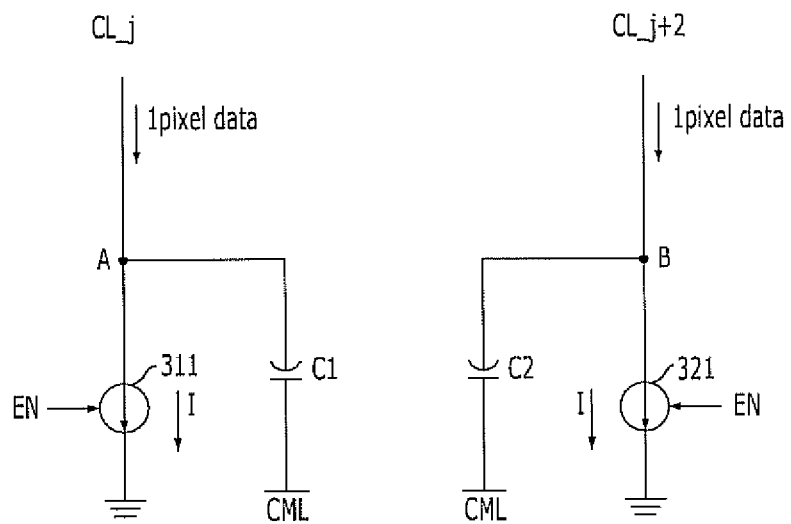
FIG. 5 illustrates a normal mode operation of the column circuit shown in FIG. 3.

FIG. 5 illustrates a normal mode operation of the column circuit 130.

During a normal-mode operation, the first switch LSW0, the second switch LSW1, the third switch SSW0, and the fourth switch SSW1 are closed (e.g., turned on), and the enable signal for enabling the first current source 311 and the second current source 321 is enabled.

Data of one pixel is outputted from the first column line CL_j and stored in the first capacitor C1, and data of another pixel is outputted from the second column line CL_j+2 and stored in the second capacitor C2. The data stored in the first capacitor C1 and the data stored in the second capacitor C2 are converted into two different digital values through an analog-to-digital conversion.

In other words, in the normal mode, the first column read circuit 310 and the second column read circuit 320 operate independently and read data outputted through the column lines CL_j and CL_j+2 corresponding thereto.

Figure 6:
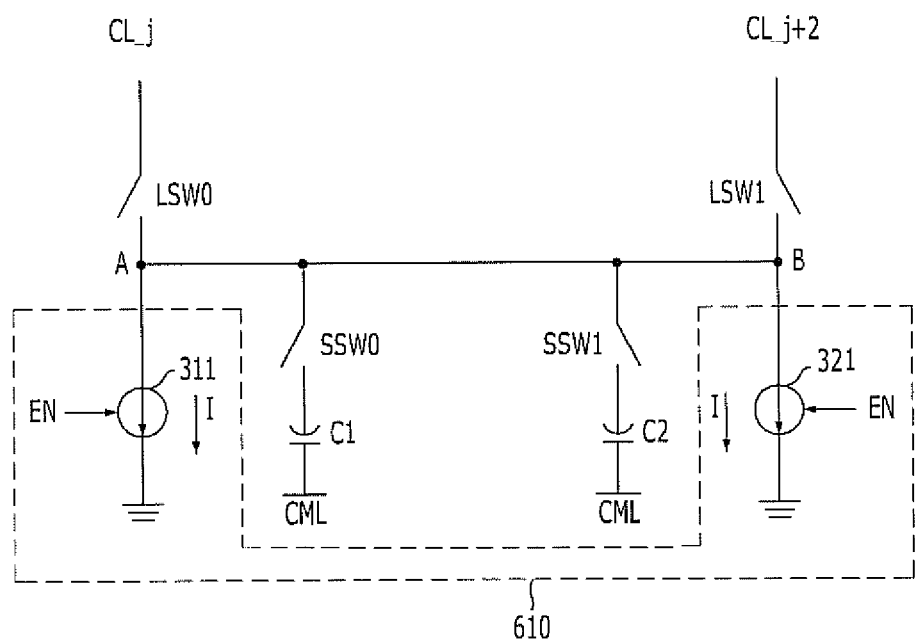
FIG. 6 illustrates a binning circuit in accordance with an exemplary embodiment of the present invention.

FIG. 6 illustrates a binning circuit in accordance with an exemplary embodiment of the present invention.

Referring to FIG. 6, the binning circuit may be formed without the fifth switch AV0 of the column circuit 130 shown in FIG. 3. In other words, the column circuit 130 shown in FIG. 3 is a circuit capable of operating both in the binning mode and the normal mode, while the binning circuit shown in FIG. 6 is a circuit capable of operating in only the binning mode.

Referring to FIG. 6, the binning circuit includes a data node A, a discharge unit 610, a first capacitor C1, and a second capacitor C2. The data node A receives data from two or more pixels of a first column line CL_j in a first phase, and receives data from two or more pixels of a second column line CL_j+2 in a second phase. The discharge unit 610 discharges charges of the data node A in the first phase and the second phase. The first capacitor C1 is coupled with the data node A in the first phase and a third phase. The second capacitor C2 is coupled with the data node A in the second phase and the third phase.

The discharge unit 610 includes a first current source 311 and a second current source 321 that are coupled to the data node A. Each of the current sources 311 and 321 supplies the same amount of current as the current I used when data from one pixel is read. A signal for enabling the discharge unit 610 is enabled in the first phase and the second phase.

Since the binning circuit operates during the first to third phases, in a manner similar to the binning mode of the column circuit 130 described with regards to FIGS. 4A-4C, further description of the binning circuit is omitted herein.

According to the technology of an exemplary embodiment of the present invention, a circuit can operate in a normal mode and a binning mode with a structure of using two column read circuits. Therefore, the circuit area may be reduced.

Also, according to the technology of an exemplary embodiment of the present invention, since a binning operation is performed not in the inside of a pixel array but in a peripheral circuit region, the binning operation may be performed regardless of the pixel structure.

In addition, since source followers, i.e., current sources, of an adjacent column are shared during the binning operation without changing their current value, accurate sensing of pixel data is secured.

While the present invention has been described with respect to the specific embodiments, it will be apparent to those skilled in the art that various changes and modifications may be made without departing from the spirit and scope of the invention as defined in the following claims.

What is claimed is:

1. A column circuit for an image sensor, comprising:
   a first capacitor;
   a second capacitor;
   a first switch configured to couple a first column line with a first node;
   a second switch configured to couple a second column line with a second node;
   a first current source coupled with the first node;
   a second current source coupled with the second node;
   a third switch configured to couple the first capacitor with the first node;
   a fourth switch configured to couple the second capacitor with the second node; and
   a fifth switch configured to couple the first node with the second node.

2. The column circuit of claim 1, wherein, in a first phase of a binning mode, data are outputted from two or more pixels through the first column line and the first switch, the third switch, and the fifth switch are closed;
   in a second phase of the binning mode, data are outputted from two or more pixels through the second column line and the second switch, the fourth switch, and the fifth switch are closed; and
   in a third phase of the binning mode, the fifth switch is closed.

3. The column circuit of claim 2, wherein the first current source and the second current source are enabled in the first and second phases of the binning mode, and disabled in the third phase of the binning mode.

4. The column circuit of claim 2, wherein the pixels outputting the data through the first column line and the pixels outputting the data through the second column line in the binning mode are adjacent pixels for detecting an identical color.

5. The column circuit of claim 1, wherein, in a normal mode, the first to fourth switches are closed, and data is outputted from one pixel through the first column line and data is outputted from one pixel through the second column line.

6. A pixel binning circuit, comprising:
   a data node configured to receive data of two or more pixels through a first column line in a first phase, and receive data of two or more pixels through a second column line in a second phase;

a discharge unit configured to discharge charges of the data node in the first phase and the second phase;

a first capacitor coupled with the data node in the first phase and a third phase; and a second capacitor coupled with the data node in the second phase and the third phase.

7. The pixel binning circuit of claim 6, wherein the discharge unit comprises two current sources coupled with the data node, and each of the two current sources supply an identical amount of current used when data of one pixel is read.

8. The pixel binning circuit of claim 6, wherein the discharge unit is enabled in the first phase and the second phase.

* * * * *